(12) United States Patent
Lax et al.

(10) Patent No.: US 9,911,339 B2
(45) Date of Patent: Mar. 6, 2018

(54) EXPERIMENTAL REAL-TIME PERFORMANCE ENHANCEMENT FOR AIRCRAFT

(71) Applicant: GE Aviation Systems LLC, Grand Rapids, MI (US)

(72) Inventors: David Michael Lax, Grand Rapids, MI (US); Sridhar Adibhatla, Glendale, OH (US); Szabolcs Andras Borgyos, Wyoming, MI (US); Mark Lawrence Darnell, Grand Rapids, MI (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 0 days.

(21) Appl. No.: 14/933,054

(22) Filed: Nov. 5, 2015

(65) Prior Publication Data
US 2017/0132938 A1 May 11, 2017

(51) Int. Cl.
*G05D 1/00* (2006.01)
*G08G 5/00* (2006.01)
*G06F 17/50* (2006.01)

(52) U.S. Cl.
CPC .......... *G08G 5/0039* (2013.01); *G06F 17/50* (2013.01); *G08G 5/0095* (2013.01)

(58) Field of Classification Search
USPC .......................................................... 701/7
See application file for complete search history.

(56) References Cited

U.S. PATENT DOCUMENTS

| 4,159,088 A | 6/1979 | Cosley |
| 5,070,458 A | 12/1991 | Gilmore et al. |
| 5,121,325 A | 6/1992 | Dejonge |

(Continued)

FOREIGN PATENT DOCUMENTS

GB 2 435 534 A 8/2007

OTHER PUBLICATIONS

Taylor et al. "Engine Yaw Augmentation for Hybrid-Wing-Body Aircraft via Optimal Control Allocation Techniques", DFRC-E-DAA-TN3574, DFRC-E-DAA-TN3895, retrieved from http://ntrs.nasa.gov/archive/nasa/casi.ntrs.nasa.gov/20110016018, 2011.

(Continued)

*Primary Examiner* — Tyler D Paige
(74) *Attorney, Agent, or Firm* — GE Aviation Patent Operation; William S. Munnerlyn

(57) ABSTRACT

Systems and methods for enhancing aircraft performance are provided. In one example, a method can include accessing an initial model that defines operating cost of an aircraft at a series of model operating states. The method also can include identifying one or more sample operating states for analyzing aircraft cost during flight. The method also can include receiving one or more real-time flight performance parameters indicative of aircraft operating cost while the aircraft is operating at the identified sample operating states. The method also can include generating an updated model that defines operating cost of the aircraft using the initial model as well as data defined by the real-time flight performance parameters. The method also can include determining an enhanced operating state based at least in part on the updated model and outputting the enhanced operating state for control of the aircraft.

19 Claims, 5 Drawing Sheets

(56) References Cited

U.S. PATENT DOCUMENTS

| | | | |
|---|---|---|---|
| 5,457,634 | A | 10/1995 | Chakravarty |
| 5,908,176 | A | 6/1999 | Gilyard |
| 6,341,247 | B1 | 1/2002 | Hreha et al. |
| 7,606,641 | B2 | 10/2009 | Allen |
| 8,423,430 | B2 | 4/2013 | Avery et al. |
| 8,509,968 | B1 | 8/2013 | Saccone et al. |
| 8,825,237 | B2 | 9/2014 | Covington et al. |
| 9,061,756 | B2 | 6/2015 | Jang et al. |
| 2011/0016018 | A1 | 1/2011 | Smith et al. |
| 2012/0191332 | A1* | 7/2012 | Sawhill ............... G08G 5/0013 701/120 |
| 2013/0066515 | A1 | 3/2013 | Sudolsky et al. |
| 2013/0204469 | A1 | 8/2013 | Horsager et al. |
| 2013/0268501 | A1 | 10/2013 | Gorinevsky |
| 2015/0279218 | A1* | 10/2015 | Irrgang ............... G08G 5/0039 701/3 |
| 2015/0379408 | A1* | 12/2015 | Kapoor ............... G01W 1/10 706/46 |

OTHER PUBLICATIONS

Pinpoint Laser Systems, "Laser Alignment for Aircraft Applications", retrieved from http://pinpointlaser.com/industry/aircraft, version dated Nov. 19, 2014, retrieved from interne archive https://web.archive.org/web/20141119161749/http://pinpointlasercom/industries/aircraft/ on Sep. 30, 2016.

Extended European Search Report and Opinion issued in connection with corresponding EP Application No. 16196831.8 dated Mar. 9, 2017.

\* cited by examiner

EXPERIMENTAL REAL-TIME PERFORMANCE ENHANCEMENT FOR AIRCRAFT

FIELD OF THE INVENTION

The present subject matter relates generally to enhancing the performance of an aircraft.

BACKGROUND OF THE INVENTION

Avionics systems located on aircraft can be used to determine optimal or enhanced operating states of the aircraft based on various operating conditions and other parameters. For instance, data indicative of engine operating modes, flight path information, engine parameters (e.g., throttle setting, fuel flow, etc.), altitude, trim conditions, weight, and other operating parameters can be used to determine control variables, such as speed and/or altitude of an aircraft, to reduce the cost of conducting a flight. The cost of a flight can be defined, for instance, in terms of fuel consumption and/or time to achieve a flight range associated with the flight. The aircraft can be controlled in accordance with the determined operating variables to increase efficiency.

Conventional approaches for enhancing aircraft performance can include selecting operating commands that reduce direct operating cost based on a model of the aircraft performance. Known models can describe the nominal performance of the aircraft type. This approach can limit the level of efficiency that may be achieved because it fails to account for aircraft-specific variations, including but not limited to engine performance, slight differences in the shape of the vehicle body, and sensor errors. Additional limitations arise using models that fail to account for performance variations from flight-to-flight and un-modeled effects. Examples of these types of variations can include weight, center of gravity, surface cleanliness, and high-order terms in simplified engine models.

Analysis of existing performance modeling and optimization systems has confirmed and quantified some of the above limitations. For example, engine performance simulation using computer models has shown that existing models are typically either over-smoothed (do not include high-order effects) or are fitted experimentally to different flights (failing to account for aircraft-specific high-order effects.) In both cases, the existing models contain errors between the model and truth, which in some cases can amount to a full percentage point or more difference in operating cost when used to determine enhanced aircraft control. Other research has shown that various airframe effects may account for several percent differences in aerodynamic forces and moments. As such, a need remains for more accurate aircraft performance modeling for optimization that can achieve additional efficiency in aircraft operation.

BRIEF DESCRIPTION OF THE INVENTION

Aspects and advantages of embodiments of the present disclosure will be set forth in part in the following description, or may be learned from the description, or may be learned through practice of the embodiments.

One example aspect of the present disclosure is directed to a computer-implemented method of enhancing aircraft performance. The method can include identifying, by one or more computing devices, one or more sample operating states for analyzing aircraft cost during flight while an aircraft is operating at the one or more identified sample operating states. The method can further include receiving, by the one or more computing devices, one or more real-time flight performance parameters indicative of aircraft operating cost while the aircraft is operating at the one or more identified sample operating states. The method can still further include generating, by the one or more computing devices, an updated model that defines operating cost of the aircraft. The updated model can be generated using the data defined by the real-time flight performance parameters indicative of aircraft cost at the one or more identified sample operating states. The method can still further include determining, by the one or more computing devices, an operating state based at least in part on the updated model. The method can still further include outputting, by the one or more computing devices, the enhanced operating state for control of the aircraft.

Other example aspects of the present disclosure are directed to systems, non-transitory computer-readable media, aircraft, devices, processes, and apparatus for enhancing aircraft performance.

Variations and modifications can be made to these example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION OF THE INVENTION

Figure 1:
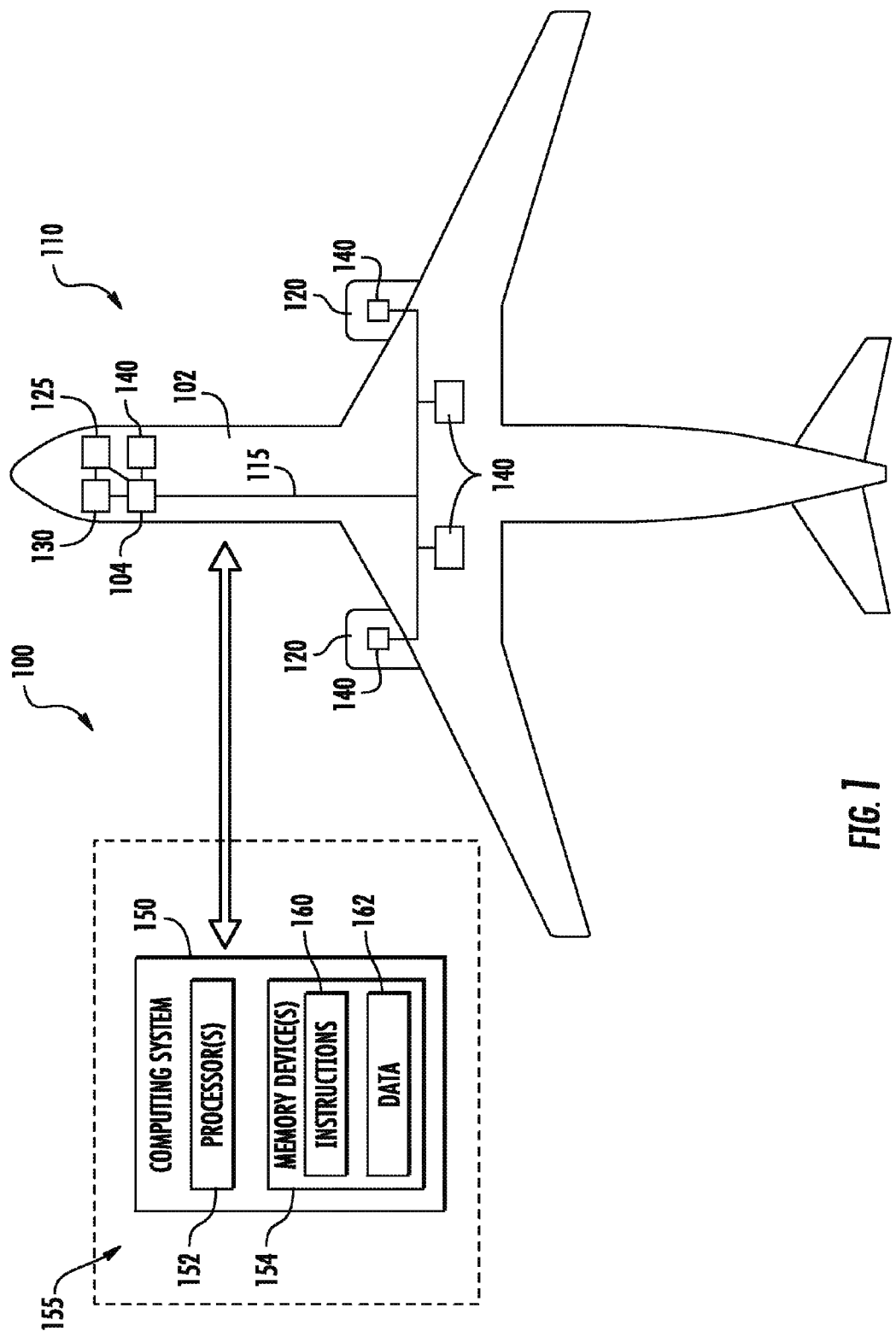
FIG. 1 depicts an overview of an example system according to example embodiments of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to systems and methods for improving real-time performance for an aircraft, for instance, by determining an enhanced operating state that reduces direct operating cost of the aircraft using data collected at a series of sample operating states obtained during flight. For instance, sample operating states can be determined near a region of interest from an initial model of aircraft operating cost versus operating state. Actual flight performance parameter data can be obtained at the one or more identified sample operating states. This data then can be used to generate an updated model of aircraft operating cost versus aircraft operating state having an enhanced operating state identified from the updated model. The enhanced operating state identified from the updated model can then be provided as output and used to control the aircraft for enhanced performance and reduced cost. The system and methods can be implemented at least in part using a computing system onboard the aircraft.

As used herein, an enhanced operating state is an operating state determined using example aspects of the present disclosure. For instance, an enhanced operating state can be an operating state that reduces a cost of operation of the aircraft relative to a previous operating state. The enhanced operating state and other operating states described herein can be related to operating controls based on aircraft system equations or performance models. Such operating controls, including enhanced operating controls related to enhanced operating states determined in example embodiments, can be provided as input to a flight control system to achieve corresponding operating states.

The disclosed systems and methods can have a technical effect of accurately estimating the relation between operating state and aircraft operating cost to account for high order physical effects and individual aircraft-specific effects that are typically disregarded in conventional performance modeling and optimization techniques. Advantages including lower operating cost can be realized through better knowledge of the true aircraft performance using the disclosed techniques as opposed to static models of nominal performance determined a priori. The disclosed techniques offer an approach for achieving cost reduction through experimental real-time operation that is fully compliant with instrument flight rules.

Additional advantages can be recognized by using real-time experimental data obtained at sample operating states determined within a region of interest from an initial model relating operating state to operating cost. This approach can increase aircraft performance in a more efficient manner than control system techniques that dynamically adjust operating state without considering a region of interest from an initial model. Additionally, each sample operating state may be measured for different lengths of time depending on required cost accuracy. Determinism in the experimental sampling process allows a user to anticipate aircraft operating state changes, and thus the user can approve or reject state changes according to interactions with air traffic and air traffic controllers while maintaining a constant steady-state that complies with instrument flight rules and operating guidelines.

The disclosed techniques also can reduce dependence on a pre-defined performance model in favor of measured data processed to derive the direct operating cost as a function of operating state. The real-time aspect of the disclosed techniques accounts for variations in individual aircraft performance on the basis of different operating states. No dependence on the changing condition of the airframe or the engines is assumed. The resulting commanded operating state is tuned based on the current condition of the aircraft and the engines, not what they were on a different day or different operational scenario. As such, accuracy of the disclosed methods can be dependent on the accuracy of onboard sensors rather than on assumptions or simplifications in an a priori performance model.

FIG. 1 depicts an example system 100 for enhancing performance of an aircraft 102 according to example embodiments of the present disclosure. As shown, the system 100 includes an onboard computing system 110 that is located on the aircraft 102 and a remote computing system 150 that is located at a remote location 155 remote from or separated from the aircraft 102.

As shown in FIG. 1, the onboard computing system 110 can include one or more computing devices 104 that can be associated with, for instance, an avionics system. The computing device(s) 104 can be coupled to a variety of systems on the aircraft 102 over a communications network 115. The communications network 115 can include a data bus or combination of wired and/or wireless communication links.

The computing device 104 can be in communication with a display system 125 including one or more display devices that can be configured to display or otherwise provide information generated or received by the system 100 to operators of the aircraft 102. The display system 125 can include a primary flight display, a multipurpose control display unit, or other suitable flight display commonly included within a cockpit of the aircraft 102. By way of non-limiting example, the display system 125 can be used for displaying flight information such as airspeed, altitude, attitude, and bearing of the aircraft 102.

The computing device 104 also can be in communication with a flight control computer 130. The flight control computer 130 can, among other things, automate the tasks of piloting and tracking the flight plan of the aircraft 102. The flight control computer 130 can include or be associated with, any suitable number of individual microprocessors, power supplies, storage devices, interface cards, auto flight systems, flight management computers, and other standard components. The flight control computer 130 can include or cooperate with any number of software programs (e.g., flight management programs) or instructions designed to carry out the various methods, process tasks, calculations, and control/display functions necessary for operation of the aircraft 130. The flight control computer 130 is illustrated as being separate from computing device(s) 104. Those of ordinary skill in the art, using the disclosures provided herein, will understand that the flight control computer 130 also can be included with or implemented by the computing device(s) 104.

The computing device(s) 104 also can be in communication with various aircraft systems 140, such as aircraft systems 140 associated with one or more propulsion engines 120 and other components of the aircraft 102. The aircraft systems 140 can include, for instance, digital control systems, throttle systems, inertial reference systems, flight instrument systems, engine control systems, auxiliary power systems, fuel monitoring system, engine vibration monitoring systems, communications systems, flap control systems, flight data acquisition systems, and other systems. The aircraft systems 140 can provide various operating parameters to the computing device(s) 104 for use in determining an operating state of aircraft 102 according to example embodiments of the present disclosure.

For instance, one or more of the aircraft systems 140 can provide flight path data, atmospheric state data and engine state data to the computing device 104 for use in determining an operating state of the aircraft 102. Flight path data can include information such as, but not limited to, altitude, speed, bearing, location and/or other information associated with a flight path of the aircraft. Engine parameter data can include information such as, but not limited to, engine mode data, throttle information, fuel flow, and other information. Atmospheric state data can include information such as, but not limited to, temperature, pressure, dynamic pressure, airspeed and Mach number.

Referring still to FIG. 1, the system 100 further includes remote computing system 150. Remote computing system 150 is located at remote location 155 that is separated and remote from the computing system 110 located onboard the aircraft 102. Similar to the computing device(s) 104, the computing system 150 can include one or more processors 152 and one or more memory devices 154. The one or more memory devices 154 can store computer-readable instructions 160 that when executed by the one or more processors 152 cause the one or more processors 152 to perform operations, such as accessing initial models or operating parameters for use by the onboard computing system 110. The memory devices 154 can further store data 162. The data 162 can include, for instance, initial and/or updated models of operating cost of an aircraft.

Figure 2:
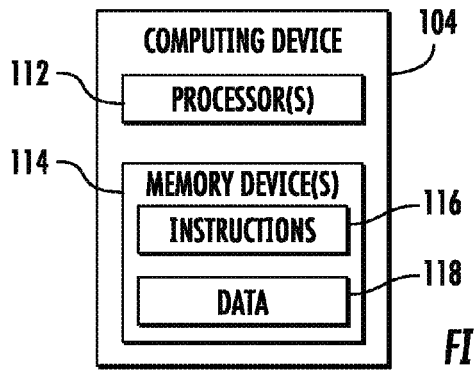
FIG. 2 depicts components of an example computing system implemented onboard an aircraft according to example embodiments of the present disclosure.

FIG. 2 depicts various components of the computing device(s) 104 according to example embodiments of the present disclosure. As shown, the computing device(s) 104 can include one or more processors 112 and one or more memory devices 114. The one or more processors 112 can include any suitable processing device, such as a microprocessor, microcontroller, integrated circuit, logic device, or other suitable processing device. The one or more memory devices 114 can include one or more computer-readable media, including, but not limited to, non-transitory computer-readable media, RAM, ROM, hard drives, flash drives, or other memory devices.

The one or more memory devices 114 can store information accessible by the one or more processors 112, including computer-readable instructions 116 that can be executed by the one or more processors 112. The instructions 116 can be any set of instructions that when executed by the one or more processors 112, cause the one or more processors 112 to perform operations. The instructions 116 can be written in any suitable programming language or can be implemented in hardware. In some embodiments, the instructions 116 can be executed by the one or more processors 112 to cause the one or more processors to perform operations, such as the operations for enhancing aircraft performance described with reference to FIGS. 3 and 4.

Referring to FIG. 2, the memory devices 114 can further store data 118 that can be accessed by the processors 112. The data 118 can include, for instance, data used to determine an operating state for an aircraft. For example, the data 118 can include operating parameters determined, for instance, by the remote computing system 150 of FIG. 1. The data 118 also can include data associated with initial or updated models, sample operating states, operating cost estimates, performance parameter data or other data used to perform aircraft performance enhancement processes according to example embodiments of the present disclosure.

Figure 3:
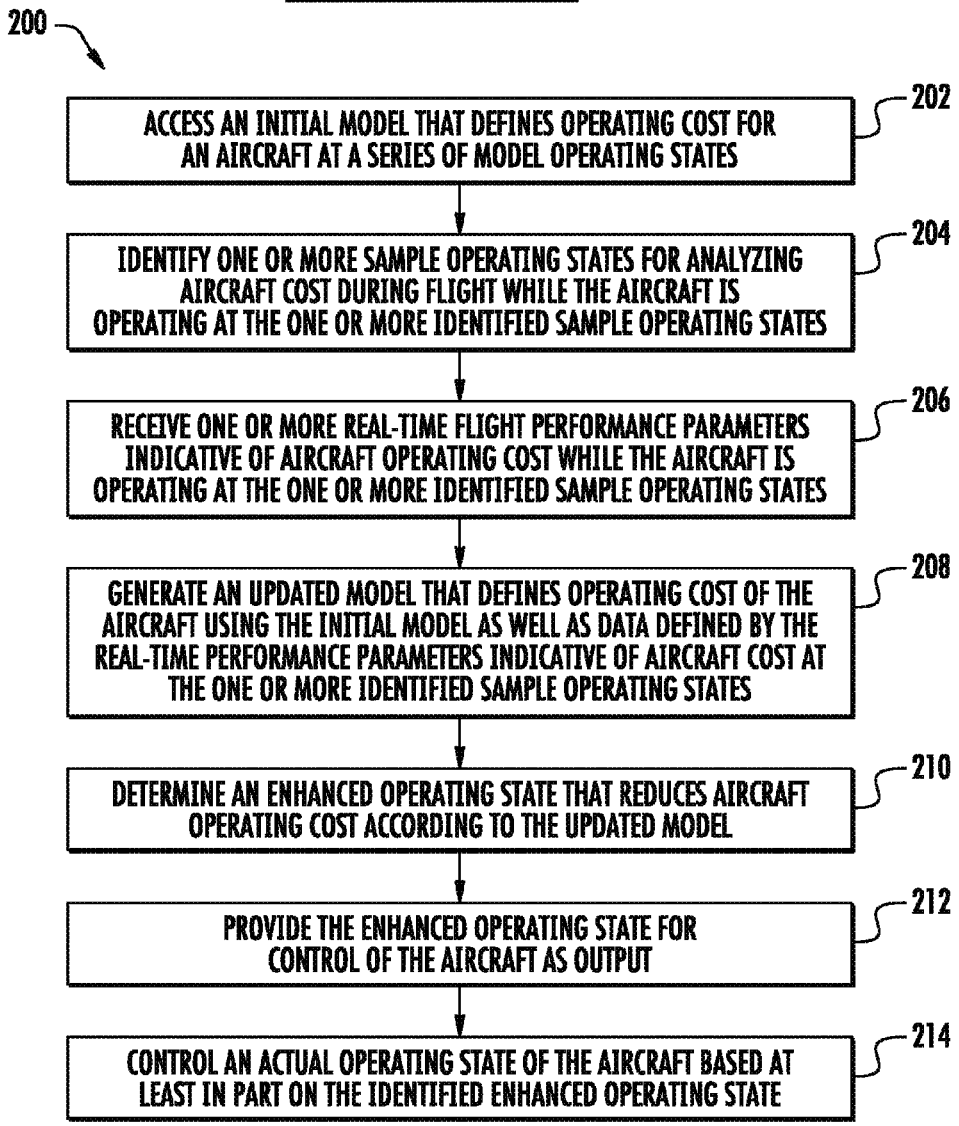
FIG. 3 provides a flow chart of an example method for enhancing aircraft performance according to example embodiments of the present disclosure.

FIG. 3 depicts a flow diagram of an example method (200) of enhancing aircraft performance according to example embodiments of the present disclosure. FIG. 3 can be implemented by one or more computing devices, such as the computing device(s) 104 depicted in FIG. 1. In addition, FIG. 3 depicts steps performed in a particular order for purposes of illustration and discussion. Those of ordinary skill in the art, using the disclosures provided herein, will understand that the various steps of any of the methods disclosed herein can be modified, adapted, expanded, rearranged and/or omitted in various ways without deviating from the scope of the present disclosure.

At (202), the method (200) can include accessing (202) an initial model that defines operating cost of an aircraft at a series of model operating states. The model operating states can include but are not limited to altitude, weight and/or airspeed (or throttle) settings. The initial model can define cost and speed points based on previous statistical data. In some examples, the initial model is an a priori model, i.e., a static model of the nominal or average vehicle performance that is developed a priori based primarily from theoretical deduction rather than from observation or experience at real-time operating states. In some examples, the initial model can be developed from real-time operating data over a range of different aircraft and different flights. However, such initial models using averaged data from previous flights can still be limited in that they do not account for aircraft-specific characteristics at a particular time and flight.

The initial model accessed at (202) can include an initial enhanced operating state at which aircraft operating cost is reduced according to the initial model. In some examples, the initial enhanced operating state can correspond with an altitude and airspeed for reducing aircraft operating cost. Other embodiments can seek to identify different operating state parameters for enhancing other performance or cost variables. In some embodiments, accessing an initial model at (202) can be an optional step.

Figure 5:
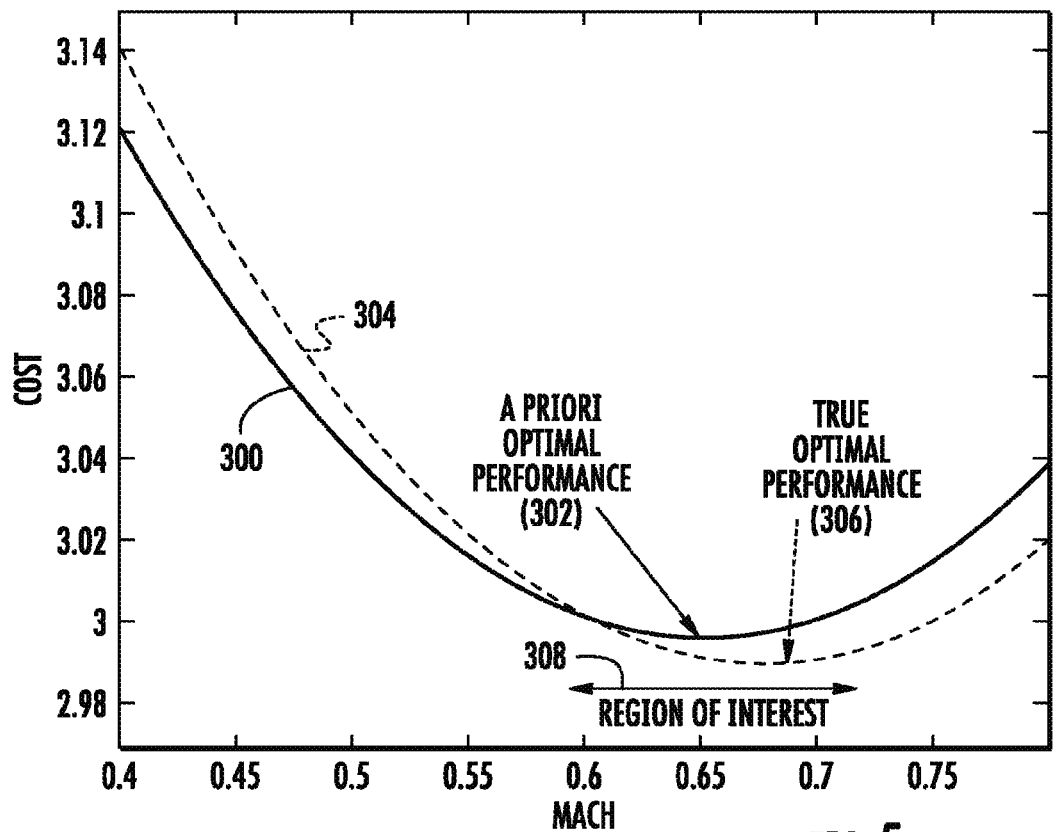
FIG. 5 depicts a graphical representation of an example comparison between an a priori model estimating aircraft operating cost versus true values for aircraft operating cost according to example embodiments of the present disclosure.

FIG. 5 depicts an example initial model or a priori model 300, for which operating cost is enhanced at an optimum or minimum airspeed point 302. The initial model 300 in FIG. 5 is compared against curve 304, representing true values for aircraft operating cost during a particular flight. From the comparison of true cost relation curve 304 to the initial model curve 300, it can be appreciated that inaccuracies often exist within modeled values. This can be seen in the difference between the modeled enhanced operating point 302 versus the actual or true enhanced operating point 306. Aspects of the example embodiments seek to determine an enhanced operating state closer to true operating point 302 than an initially modeled enhanced operating point 300.

Referring still to FIG. 3, one or more sample operating states can be identified at (204) for analyzing aircraft cost during flight while the aircraft is operating at the one or more identified sample operating states. The sample operating states identified at (204) can include one or more of altitude, weight, groundspeed, and/or airspeed (or throttle) settings. In some examples, the sample operating states identified at (204) can be defined as different airspeeds (or throttle) commands at a given constant altitude. In other examples, the sample operating states identified at (204) can be defined as different combinations of airspeeds and altitudes.

In some examples, the sample operating states identified at (204) are selected at or near an initial operating state of the aircraft. An initial operating point of the aircraft may be a steady state condition selected using a priori aircraft optimization, selected based on the uncertainty of the cost or selected arbitrarily. In examples where optional step (202) of accessing an initial model is not utilized, the sample operating states identified at (204) can be chosen based on an assumption of equal uncertainty at all operating states. As flight parameter data and other information is gathered during method (200), cost models can be built as operating state points are tried and new operating states can be chosen based on the developing model and obtained flight performance data.

In some examples, the sample operating states identified at (204) are selected from model operating points that are within a region of interest in the initial model accessed at (202), for instance, at or near an initial enhanced operating state. For example, referring to the initial model 300 of FIG. 5, a region of interest 308 can be defined relative to initial enhanced operating point 302 such that sample operating points are selected as airspeeds within region of interest 308. The region of interest can thus be considered a search region for identifying a set of trial points to gather performance information with the goal of helping to update a more accurate or true enhanced operating state for the aircraft. The process of finding the true enhanced speed or other operating state may be accelerated by identifying sample operating states at (204) from an initial model accessed at (202).

The sample operating states identified at (204) can be defined in a variety of manners relative to a region of interest. In some examples, the sample operating states identified at (204) can be selected as evenly spaced within a region of interest. In some examples, the sample operating states can be selected arbitrarily or randomly within a region of interest. In some examples, the sample operating states can be optimally selected to reduce uncertainty in the cost-to-operating-state relation. In some examples, a comprehensive set of sample operating states can be identified at (204) all at once at the beginning of method (200). In some examples, sample operating states can be identified at (204) one at a time based on results from successive iterations of method (200) using different experimental sample operating states.

In one particular example, sample operating states can be identified at (204) to reduce the uncertainty in the operating-state-versus-cost relation using a Gaussian process to estimate the cost function. Representing the aforementioned cost function using a Gaussian process can be ideal for the ability of the model to represent complex phenomena and incorporate cost information available in the cost model a priori. An a priori cost model is representative of the cost measured during flight testing of the aircraft, e.g., non-deteriorated engines and likely clean aircraft surfaces. At a time of manufacture, the uncertainty in the a priori cost function can be minimal. As the aircraft engines age and the fuselage is subject to dirt, wear and icing during some flights, the cost function can become increasingly more uncertain and the operating minimum varies with the actual cost function. Starting with the a priori cost function and the initial operating point, a Gaussian Process Regression (GPR) model can be constructed and optimized to identify successive sample operating state points at (204).

Once one or more sample operating states are determined at (204), an aircraft system can adjust its control targets to achieve the specified steady state defined by the sample operating states. While the aircraft is performing at each state identified at (204), one or more real-time flight performance parameters indicative of aircraft operating cost can be received at (206). Factors related to aircraft condition, such as engine health or airframe cleanliness, can be accounted for by using vehicle measurements instead of a priori performance models which do not typically account for such aircraft behavior factors.

In some examples, the measured flight performance parameters can estimate a quantity derived from a rate of fuel consumption for the aircraft. In some examples, the measured flight performance parameters can estimate a ratio of the rate of fuel consumption to groundspeed or airspeed. This can be determined, for example, using aircraft sensors to estimate the direct operating cost. Other methods used to estimate the rate of fuel consumption include direct measurement, engine fuel flow sensors, aircraft weight-change estimation, etc. or an estimate derived by fusing the data. The details of these methods as well as different formulations of direct operating cost functions are generally understood by one of skill in the art. Additional aspects related to flying an aircraft at each of the sample operating states and gathering flight performance parameter data are presented in FIG. 4.

The sample operating states identified in (204) and the flight performance parameters received at (206) can be used to define a plurality of data points, for example, data pairs of airspeed and corresponding operating cost of the aircraft. These data points can then be used to generate at (208) an updated model that defines operating cost of the aircraft. The updated model can be generated at (208) using the initial model as well as data defined by the real-time flight performance parameters indicative of aircraft cost at the one or more identified sample operating states. Similar to the initial model accessed at (202), the updated model generated at (208) can track operating cost versus speed or throttle commands.

Specific approaches for generating an updated model at (208) can vary, and sometimes but not always can depend on the form or type of the initial model accessed at (202). In general, an updated model can be generated at (208) by using the measured direct operating cost data to determine a relation between the operating state and the direct operating cost. In some examples, generating an updated model at (208) can involve approximating a function based at least in part on the data defined by the real-time flight performance parameters received at (206) that are indicative of aircraft cost at the one or more sample operating states identified at (204).

A variety of function approximation techniques can be used to generate an updated model at (208), including but not limited to interpolation, extrapolation, regression analysis and curve fitting. In some examples, a curve fitted as part of generating an updated model at (208) can be defined to assume a certain predetermined form, such as but not limited to a parametric form or parabolic form. In other examples, generating an updated model at (208) can include modeling the operating cost as a Gaussian process observed at data points corresponding to the one or more identified sample operating states. Models generated at (208) using a Gaussian process do not assume a particular form of the relation between cost and operating state, and thus allow for more types of un-modelled behavior in the cost function. During normal operation, the actual cost function can be estimated and enhanced using GPR-based optimization.

Other example approaches for generating an updated model at (208) can involve a statistical model that can be trained using a machine learning process. In some embodiments, data pairs including the sample operating states identified at (204) and real-time flight performance parameters received at (206) can be provided as training inputs to a statistical model. In some examples, the data pairs provided as training input can more specifically correspond to data pairs of airspeed and corresponding operating cost of the aircraft. The statistical model can be built using a learning algorithm such as a Neural Network, Support Vector Machine (SVM) or other machine learning process. Once the statistical model is adequately trained with a series of operating state and cost data points, the statistical model can be employed in real time to analyze subsequent operating states provided as input to the statistical model.

Figure 6:
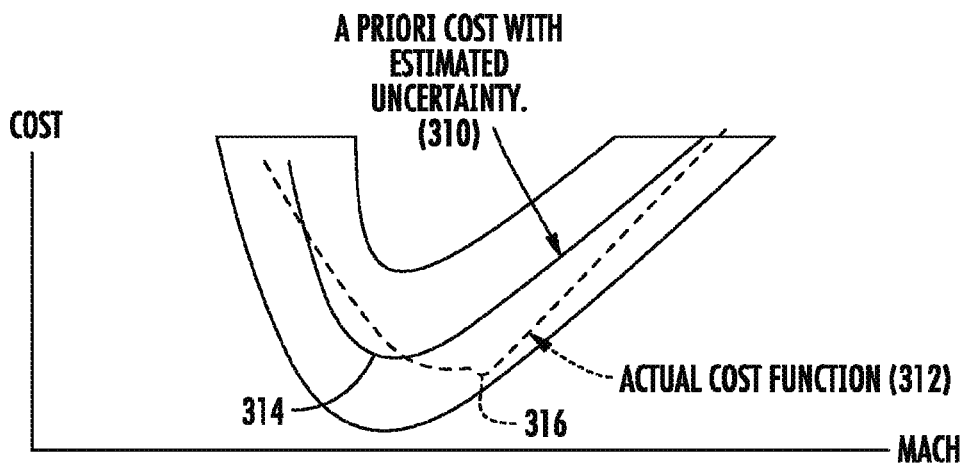
FIG. 6 depicts a graphical representation of an example initial model and an updated model of aircraft operating cost versus speed according to example embodiments of the present disclosure.
Figure 7:
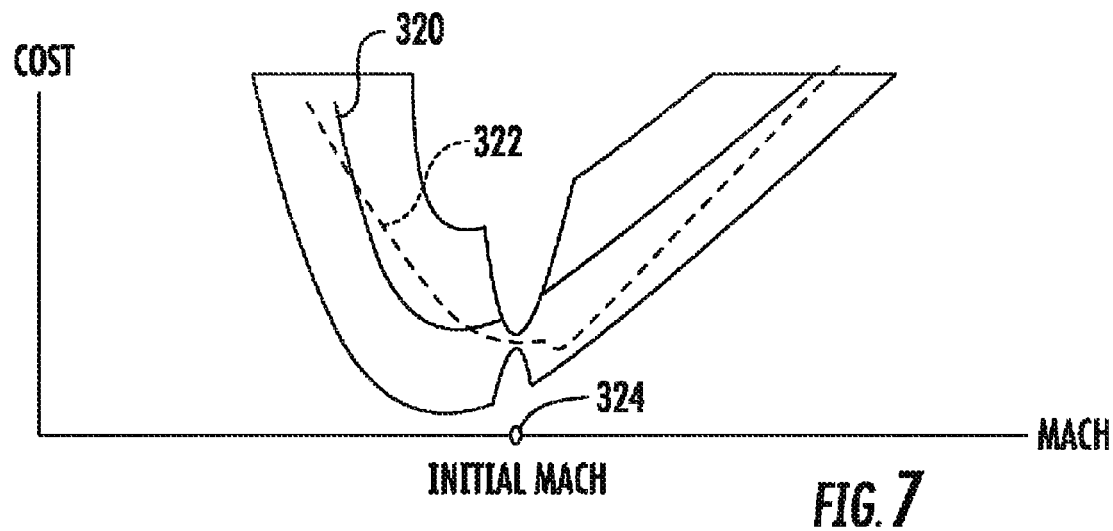
FIG. 7 depicts a graphical representation of an example initial model and an updated model of aircraft operating cost versus speed after obtaining performance data at an initial speed according to example embodiments of the present disclosure.
Figure 8:
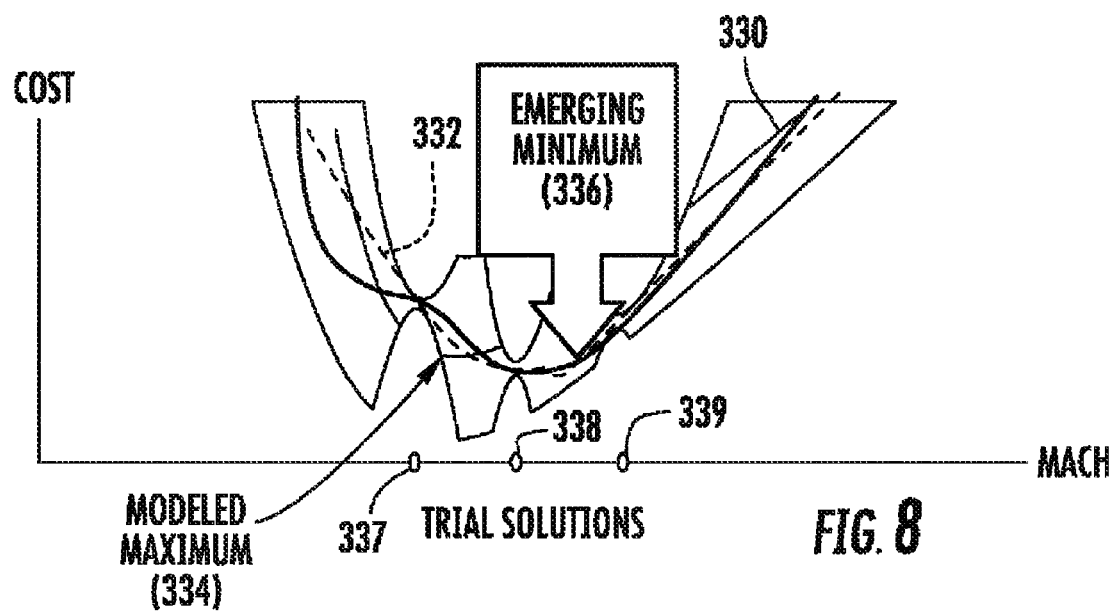
FIG. 8 depicts a graphical representation of an example initial model and an updated model of aircraft operating cost versus speed after obtaining performance data at three sample speeds according to example embodiments of the present disclosure.

FIGS. 6-8 depict various graphical representations related to the process of generating an updated model at (208). FIG. 6 depicts a graphical representation of an example initial model 310 of aircraft operating cost versus speed (Mach Number). Initial model 310 corresponds to an a priori model having some level of estimated uncertainty built into the model. FIG. 6 also depicts a graphical representation of an actual cost function curve 312. FIG. 6 illustrates how an initial enhanced operating state (i.e., speed) 314 resulting in a minimum cost value along initial model curve 310 can differ from an actual enhanced operating state 316 resulting in a minimum cost value along updated model curve 312.

FIG. 7 depicts a graphical representation of an example initial model 320 and an updated model 322 of aircraft operating cost versus speed after obtaining performance data at an initial Mach (initial speed) 324. Given an initial operating state or speed, an estimate of the actual cost is performed using aircraft sensors. Such measurement can remove uncertainty from the system around the initial Mach 324. Following a strategy weighing exploration of unknown/ uncertain cost regions against exploitation of the actual cost function minimum given all available information, the measurements can be repeated at various operating states.

As the various sample operating states are varied, additional portions of uncertainty can be removed from an a priori minimum 334 and the minimum 336 of an actual cost function begins to emerge as represented in FIG. 8. FIG. 8 depicts a graphical representation of an example initial model 330 and an updated model 332 of aircraft operating cost versus speed after obtaining cost data at three sample operating states or speeds represented as trial solutions 337, 338 and 339. Using a Gaussian process optimizer, the aircraft operating state is consequently driven to more optimal points until convergence is attained at 336. The minimum identified at point 336 can be closer to the true performance optimum point than the a priori estimated minimum at point 334 based on a priori models.

Referring again to FIG. 3, an enhanced operating state that reduces operating cost of the aircraft can be identified at (210) according to the updated model generated at (208). In some examples, the enhanced operating state identified at (210) corresponds to an optimum operating state for which aircraft operating cost is minimized. Considering the updated models depicted in FIGS. 6 and 8, the enhanced operating state identified at (210) can, for example, correspond to an operating state at point 316 in FIG. 6 or an operating state at point 336 in FIG. 8.

In some examples, an enhanced operating state can be determined or otherwise identified at (210) directly, without having to complete the entire process of generating an updated model at (208). As such, generating an updated model at (208) can be considered an optional step in some example embodiments. In these examples, the enhanced operating state identified at (210) can be determined at least in part from the one or more sample operating states identified at (204) and the one or more flight performance parameters received at (206). For example, the enhanced operating state determined at (210) can be selected from the sample operating states identified at (204) for which corresponding aircraft operating cost was measured and identified as being the lowest of the measured operating states. Other data interpolation and/or extrapolation processes can be used to determine an enhanced operating state at (210) without requiring the generation of a complete updated model at (208).

The enhanced operating state determined at (210) then can be provided at (212) as an output using a suitable output device, for example an output device accessible by an aircraft operator or computer control system. For instance, the operating state can be output by the computing device(s) 104 to the display system 125 for display to operators of the aircraft 102 of FIG. 1. Audible or other notifications of the operating state can be provided to operators of the aircraft. In some embodiments, the operating state can be output to the flight control computer 130 for the purpose of automatic control.

Referring still to FIG. 3, an actual operating state of the aircraft can be controlled at (214) based at least in part on the enhanced operating state identified at (210). For instance, in one embodiment, an operator of the aircraft 102 of FIG. 1 can manually control the aircraft in response to the operating state presented on the display system 125 of the aircraft 102 (e.g., manually control the aircraft to fly at the altitude and/or speed specified in the operating state). In another embodiment, the flight control computer 130 can automatically control the aircraft 102 (e.g., using autopilot and autothrottle) in accordance with the operating state (e.g., control the aircraft to fly at the altitude and/or speed specified in the operating state).

In some examples, an aircraft can be configured to operate at a command state corresponding to the enhanced operating state identified at (210) for the duration of a current flight. In other examples, an aircraft can be configured to operate at a command state corresponding to the enhanced operating state identified at (210) until a predetermined event occurs, at which point the method (200) can be implemented again as part of an ongoing performance enhancement process during flight. The predetermined event triggering another iteration of method (200) can correspond to a variety of occurrences, including but not limited to a next waypoint during a planned flight, a distance threshold, a weight threshold, a time threshold, or a combination of these occurrences or others. As an aircraft travels and changes performance (e.g., change in weight, change in engine health, change in wind, etc.), it may be beneficial to repeat iterations of method (200). Repeated iterations of method (200) can be based on periodically-spaced intervals defined by time or distance or at event-driven intervals such as waypoint sequencing. The process of repeated iterations of method (200) can be beneficial for longer flights when the method duration, e.g., length of time checking sample points, is much smaller than the length of time operating at an identified enhanced operating state.

Figure 4:
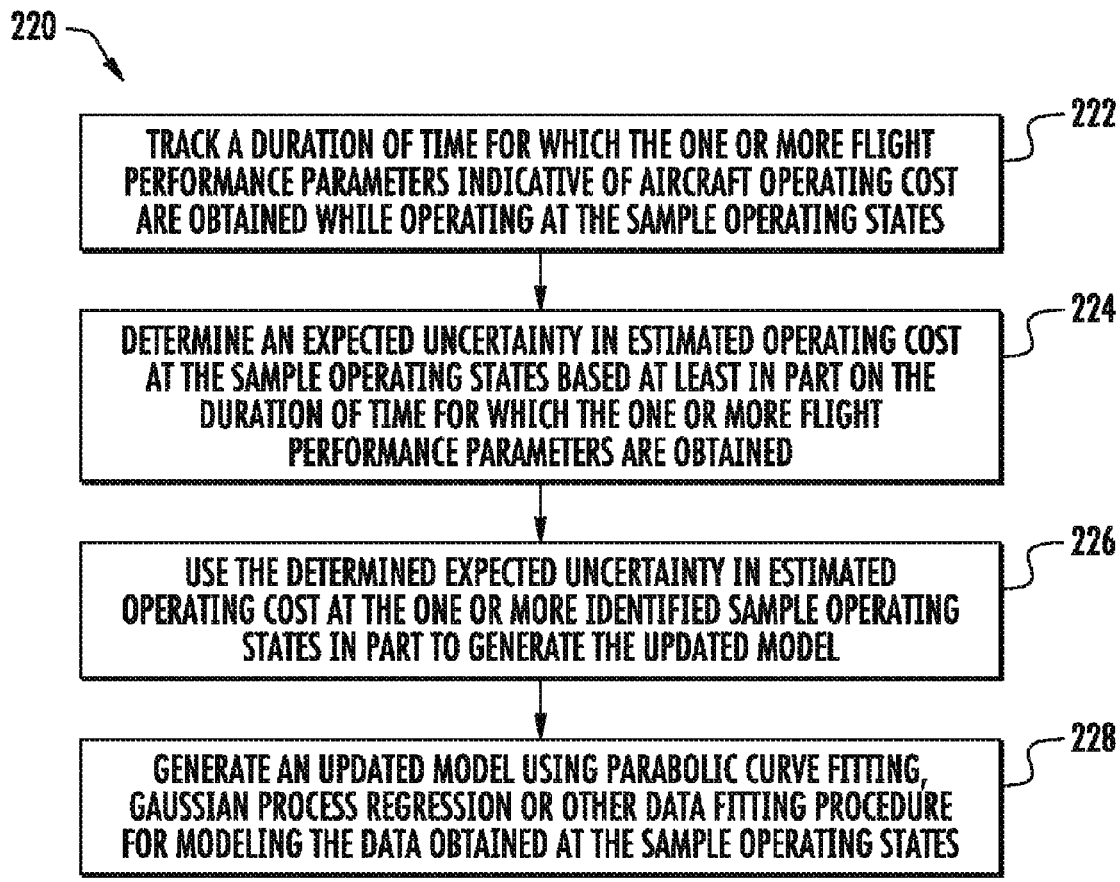
FIG. 4 provides a flow chart of additional aspects of an example method for enhancing aircraft performance according to example embodiments of the present disclosure.

FIG. 4 depicts additional aspects 220 of systems and methods for aircraft performance enhancement according to example embodiments. In some embodiments, the expected uncertainty in determined cost value at sample operating states can be computed. This expected uncertainty typically can be reduced, thus making an updated model of cost estimate more certain, by observing flight performance parameters indicative of operating cost for longer periods of time. When it is desirable to account for expected uncertainties, statistical inferencing can be utilized to help determine or track the amount of time at (222) for which flight performance parameters indicative of aircraft operating cost are monitored and ultimately received at (206).

The length of time at which performance parameter data is analyzed at each sample operating state can sometimes vary within a range, for instance, from several seconds to several minutes or more depending on sensor and estimate accuracy. In some examples, a duration of time for measuring flight performance parameter data at each sample operating state is the same. In some examples, a duration of time for measuring flight performance parameter data at each sample operating state is based at least in part on the probabilistically-expected noise in fuel and airspeed measurements. In still further examples, a duration of time for measuring flight performance parameter data received at (206) involves assigning measurement time durations for a variable duration of time to each sample operating state to help drive statistical uncertainty below a predetermined threshold value.

However the duration of time for obtaining measurements at (206) is determined, that duration of time can be identified or tracked at (222) for each of the one or more identified sample operating states. The measurements obtained at (206) and the durations of time tracked at (222) can then be used at least in part to determine at (224) an expected uncertainty in estimated operating cost at the one or more identified sample operating states. The expected uncertainty determined at (224) then can be used at least in part to help generate an updated model at (228). Generating an updated model at (228) can be similar to generating an updated model at (208), and can use any of the previously discussed techniques, including but not limited to parabolic curve fitting, Gaussian process regression (GPR) or other data fitting procedures for modeling the data obtained at the sample operating states.

Although specific design aspects of various embodiments may be shown in some drawings and not in others, this is for convenience only. In accordance with the principles of the present disclosure, any aspect of a drawing may be referenced and/or claimed in combination with any aspect of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A computer-implemented method of enhancing aircraft performance, the method comprising:

identifying, by at least one computing device, at least one sample operating state comprising at least one of airspeed or altitude, for analyzing an aircraft operational cost during a flight while an aircraft is operating at the identified at least one sample operating state;

receiving, by the at least one computing device, at least one real-time flight performance parameter indicative of the aircraft operational cost while the aircraft is operating during the flight, at the identified at least one sample operating state;

generating during the flight, by the at least one computing device, an updated model that defines the aircraft operating cost of the aircraft, wherein the updated model is generated using data received by the at least one real-time flight performance parameter indicative of aircraft operating cost at the identified at least one sample operating state;

determining during the flight, by the at least one computing device, an enhanced operating state based at least in part on the updated model; and controlling the aircraft, by the at least one computing device, in accordance with the enhanced operating state.

2. The computer-implemented method of claim 1, further comprising:

accessing an initial model that defines operating cost of an aircraft at a series of model operating states;

wherein the initial model includes an initial operating state at which aircraft operating cost is reduced according to the initial model, and wherein the sample operating states are selected from model operating points that are within a region of interest in the initial model at or near the initial operating state.

3. The computer-implemented method of claim 1, further comprising controlling, by a flight control system, the aircraft based at least in part on the enhanced operating state.

4. The computer-implemented method of claim 1, wherein outputting, by the at least one computing device, the enhanced operating state for control of the aircraft comprises providing the enhanced operating state for display on at least one display device.

5. The computer-implemented method of claim 1, wherein the at least one real-time flight performance parameter indicative of aircraft operating cost comprise parameters configured to estimate a quantity derived from a rate of fuel consumption.

6. The computer-implemented method of claim 1, wherein generating, by the at least one computing device, an updated model comprises approximating a function based at least in part on the data defined by the real-time flight performance parameters indicative of aircraft cost at the at least one identified sample operating state.

7. The computer-implemented method of claim 1, wherein generating, by the at least one computing device, an updated model comprises modeling the operating cost as a Gaussian process observed at data points corresponding to the at least one identified sample operating state.

8. The computer-implemented method of claim 1, wherein the at least one sample operating state is defined as different airspeeds at a given altitude.

9. The computer-implemented method of claim 1, further comprising:

tracking, by the at least one computing device, a duration of time for which the at least one flight performance parameter indicative of aircraft operating cost are obtained while the aircraft is operating at or near the at least one identified sample operating state; and determining, by the at least one computing device, an expected uncertainty in estimated operating cost at the at least one identified sample operating state based at least in part on the duration of time for which the at least one flight performance parameter is obtained;

wherein the determined expected uncertainty in estimated operating cost at the at least one identified sample operating state is used at least in part for generating the updated model.

10. A tangible, non-transitory computer-readable media storing computer-readable instructions that when executed by a processor cause the processor to perform operations, the operations comprising:

accessing an initial model that defines an operating cost of an aircraft at a series of model operating states;

identifying at least one sample operating state comprising at least one of airspeed or altitude, for analyzing aircraft the operating cost during flight while the aircraft is operating at the at least one identified sample operating state;

receiving at least one real-time flight performance parameter indicative of the aircraft operating cost while the aircraft is operating at the at least one identified sample operating state;

generating an updated model that defines the operating cost of the aircraft, wherein the updated model is generated using the initial model as well as data defined by the at least one real-time flight performance parameter indicative of aircraft operating cost at the at least one identified sample operating state;

determining an enhanced operating state based at least in part on the updated model; and controlling the aircraft in accordance with the enhanced operating state.

11. The computer-readable media of claim 10, wherein the initial model includes an initial enhanced operating state at which aircraft operating cost is reduced according to the initial model, and wherein the sample operating states are selected from model operating points that are within a region of interest in the initial model at or near the initial enhanced operating state.

12. The computer-readable media of claim 10, wherein generating an updated model comprises approximating a function based at least in part on the data defined by the at least one real-time flight performance parameter indicative of aircraft cost at the at least one identified sample operating state.

13. The computer-readable media of claim 10, wherein generating an updated model comprises modeling the aircraft operating cost as a Gaussian process observed at data points corresponding to the at least one identified sample operating state.

14. An avionics system for enhancing aircraft performance, the avionics system comprising a processor and a memory device located on an aircraft, the memory device storing instructions that when executed by the processor cause the processor to perform operations, the operations comprising:

accessing an initial model that defines an operating cost of an aircraft at a series of model operating states;

identifying at least one sample operating state comprising at least one of airspeed or altitude, for analyzing aircraft cost during flight while the aircraft is operating at the at least one identified sample operating state;

receiving at least one real-time flight performance parameter indicative of aircraft operating cost while the aircraft is operating at or near the at least one identified sample operating state;

determining, while the aircraft is operating at the at least one identified sample operating state, an enhanced operating state based at least in part from the identified at least one sample operating state and the received at least one flight performance parameter; and automatically controlling the aircraft, by the at least one computing device, in accordance with the enhanced operating state.

15. The avionics system of claim 14, wherein the model operating states comprise at least one of airspeed or altitude.

16. The avionics system of claim 14, wherein the at least one real-time flight performance parameter indicative of aircraft operating cost comprise parameters configured to estimate a quantity derived from a rate of fuel consumption.

17. The avionics system of claim 14, further comprising:
generating an updated model that defines operating cost of the aircraft, wherein the updated model is generated using the initial model as well as data defined by the real-time flight performance parameters indicative of aircraft cost at the at least one identified sample operating state;

wherein generating an updated model comprises approximating a function based at least in part on the data defined by the real-time flight performance parameters indicative of aircraft cost at the at least one identified sample operating state.

18. The avionics system of claim 17, wherein generating an updated model comprises modeling the operating cost as a Gaussian process observed at data points corresponding to the at least one identified sample operating state.

19. The avionics system of claim 14, wherein the initial model includes an initial enhanced operating state at which aircraft operating cost is reduced according to the initial model, and wherein the sample operating states are selected from model operating points that are within a region of interest in the initial model at or near the initial enhanced operating state.

* * * * *